US011296675B2

(12) United States Patent
Hirota

(10) Patent No.: US 11,296,675 B2
(45) Date of Patent: Apr. 5, 2022

(54) RESONATOR AND RESONANCE DEVICE

(71) Applicant: Murata Manufacturing Co., Ltd., Nagaokakyo (JP)

(72) Inventor: Wakana Hirota, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 723 days.

(21) Appl. No.: 16/163,684

(22) Filed: Oct. 18, 2018

(65) Prior Publication Data
US 2019/0052246 A1 Feb. 14, 2019

Related U.S. Application Data

(63) Continuation of application No. PCT/JP2017/004266, filed on Feb. 6, 2017.

(30) Foreign Application Priority Data

May 10, 2016 (JP) .............................. JP2016-094916

(51) Int. Cl.
H03H 9/21 (2006.01)
H03H 9/10 (2006.01)
(Continued)

(52) U.S. Cl.
CPC .............. *H03H 9/24* (2013.01); *H01L 41/09* (2013.01); *H01L 41/187* (2013.01); *H03H 9/02* (2013.01);
(Continued)

(58) Field of Classification Search
CPC .......... H03H 9/24; H03H 9/02; H03H 9/0595; H03H 9/1035; H03H 9/1057;
(Continued)

(56) References Cited

U.S. PATENT DOCUMENTS 7,975,546 B2 * 7/2011 Noguchi ............ G01C 19/5607
73/504.16
8,405,284 B2   3/2013 Ichikawa
(Continued)

FOREIGN PATENT DOCUMENTS

JP   2010147666 A   7/2010
JP   2012105044 A   5/2012
(Continued)

OTHER PUBLICATIONS

International Search Report issued for PCT/JP2017/004266, dated Mar. 14, 2017.
(Continued)

Primary Examiner — J. San Martin
(74) Attorney, Agent, or Firm — Arent Fox LLP

(57) ABSTRACT

The resonator includes a vibrating portion that has three or more vibrating arms each having a fixed end and an open end and at least two vibrating arms undergoing out-of-plane bending in different phases. Moreover, the resonator includes a first base portion having a first front end connected to the fixed ends and a first rear end facing the first front end, a second base portion having a second front end facing the first rear end and a second rear end facing the second front end, and a connecting portion connected between a vicinity of a center of the first rear end and a vicinity of a center of the second front end, a holding portion that is provided in at least a part of a periphery of the vibrating portion, and a holding arm that is provided between the vibrating portion and the holding portion.

19 Claims, 11 Drawing Sheets

(51) Int. Cl.
  *H03H 9/05*    (2006.01)
  *H03H 9/24*    (2006.01)
  *H01L 41/09*   (2006.01)
  *H01L 41/187*  (2006.01)
  *H03H 9/02*    (2006.01)

(52) U.S. Cl.
  CPC ........ *H03H 9/0595* (2013.01); *H03H 9/1035* (2013.01); *H03H 9/1057* (2013.01); *H03H 9/21* (2013.01); *H03H 9/2489* (2013.01)

(58) Field of Classification Search
  CPC ........ H03H 9/2489; H03H 9/21; H03H 9/215; H03H 9/2468; H03H 9/2473; H03H 9/2478; H03H 9/2494; H03H 2003/026; H03H 2003/0492; H01L 41/09; H01L 41/187
  See application file for complete search history.

(56) References Cited

U.S. PATENT DOCUMENTS

| | | | |
|---|---|---|---|
| 9,121,707 B2* | 9/2015 | Shimura | G01C 19/5621 |
| 2008/0236281 A1* | 10/2008 | Noguchi | G01C 19/5607 73/504.16 |
| 2010/0148634 A1 | 6/2010 | Ichikawa | |
| 2011/0187470 A1* | 8/2011 | Yamada | H03H 9/0547 331/155 |
| 2013/0283910 A1* | 10/2013 | Nishizawa | G01C 19/5607 73/504.12 |
| 2016/0126924 A1* | 5/2016 | Nakagawa | H03B 5/30 331/156 |
| 2017/0187351 A1 | 6/2017 | Goto et al. | |
| 2018/0212139 A1* | 7/2018 | Hirota | H03B 5/32 |

FOREIGN PATENT DOCUMENTS

| | | |
|---|---|---|
| JP | 5071058 B2 | 11/2012 |
| WO | 2016052260 A1 | 4/2016 |

OTHER PUBLICATIONS

Written Opinion of the International Searching Authority issued for PCT/JP2017/004266, dated Mar. 14, 2017.

* cited by examiner

RESONATOR AND RESONANCE DEVICE

CROSS REFERENCE TO RELATED APPLICATIONS

The present application is a continuation of PCT/JP2017/004266 filed Feb. 6, 2017, which claims priority to Japanese Patent Application No. 2016-094916, filed May 10, 2016, the entire contents of each of which are incorporated herein by reference.

TECHNICAL FIELD

The present disclosure relates to a resonator and a resonance device in which a plurality of vibrating arms vibrates in an out-of-plane bending vibration mode.

BACKGROUND

Existing resonance devices using MEMS (Micro Electro Mechanical Systems) technology have been used as a timing device, for example. This resonance device is mounted on a printed board incorporated in an electronic apparatus such as a smartphone. The resonance device includes a lower substrate, an upper substrate that forms a cavity between the lower substrate and the upper substrate, and a resonator that is disposed in the cavity between the lower substrate and the upper substrate.

For example, Patent Document 1 (identified below) discloses a resonator including a plurality of vibrating arms. In this resonator, the vibrating arms are connected, at their fixed ends, to the front end of a base portion, and the base portion is connected, at its rear end opposite the front end, to a support portion. The support portion is connected, for example, to a base interposed between the lower substrate and the upper substrate. In an example of FIG. 1 of Patent Document 1, since electric fields that are applied to the vibrating arms are set to be opposite directions to each other, vibrations in opposite phases are realized between the vibrating arm in an inner side portion and the two vibrating arms in outer side portions.

Patent Document 1: Japanese Patent No. 5071058.

During vibrations in the opposite phases, as illustrated in FIG. 1(c) of Patent Document 1, a torsional moment about a center axis extending in parallel to a Y axis is generated on each of the vibrating arms. Due to the torsional moments, bending vibration about rotational axes defined in parallel to the center axes of the adjacent vibrating arms vibrating in the opposite phases is generated between the center axes in the base portion of the resonator. This vibration is transmitted from the base portion to the base with the support portion interposed therebetween. Since the base is held between the lower substrate and the upper substrate, some extent of the vibration is damped in the base. The present inventors have found that this damping of the vibration distorts a resonant waveform and shifts a resonant frequency when amplitudes of the vibrations of the vibrating arms are large. Since the shift of the resonant frequency gives large influences on resonance characteristics and phase noise, improvement thereof is required.

SUMMARY OF THE INVENTION

It is an object of the present disclosure to suppress a shift of a resonant frequency in a resonator.

Thus, according to an exemplary aspect, a resonator is disclosed that includes a vibrating portion that has equal to or more than three vibrating arms each of which has a fixed end and an open end and among which at least two vibrating arms undergo out-of-plane bending in different phases. Moreover, a first base portion is provided having a first front end connected to the fixed ends of the equal to or more than three vibrating arms and a first rear end facing the first front end, a second base portion is provided having a second front end facing the first rear end of the first base portion and a second rear end facing the second front end, and a connecting portion is provided having one end connected to a vicinity of a center of the first rear end of the first base portion and the other end connected to a vicinity of a center of the second front end of the second base portion. Furthermore, the resonator includes a holding portion that is provided in at least a part of a periphery of the vibrating portion, and a holding arm that is provided between the vibrating portion and the holding portion and has one end connected to the second base portion and the other end connected to the holding portion.

According to the present invention, a resonator is provided that suppresses a shift of a resonant frequency in a resonator.

DETAILED DESCRIPTION OF EXEMPLARY EMBODIMENTS

First Exemplary Embodiment

Figure 1:
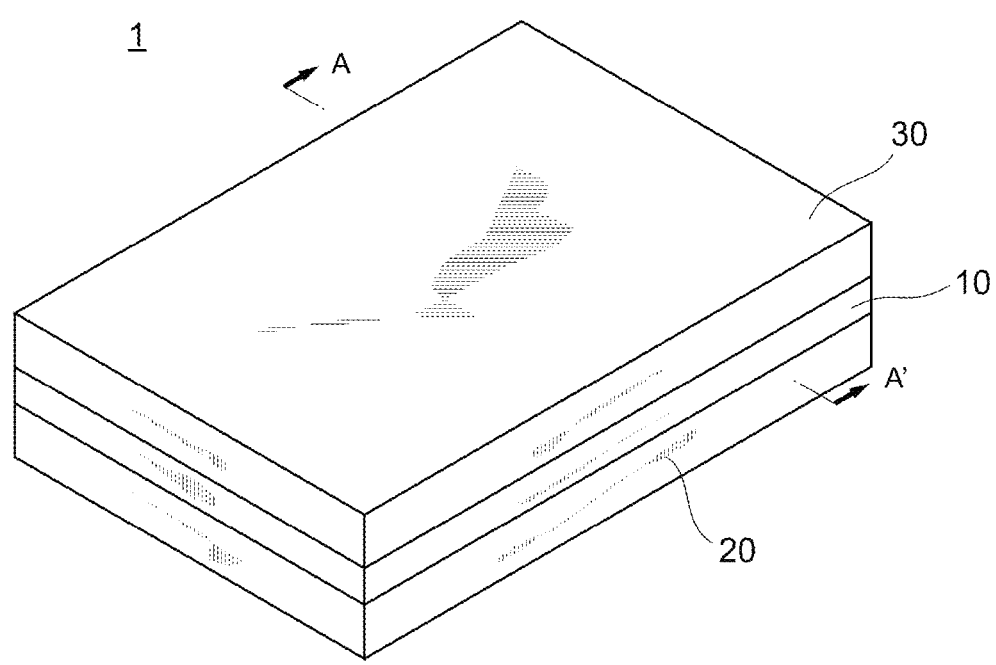
FIG. 1 is a perspective view schematically illustrating an outer appearance of a resonance device according to a first exemplary embodiment.
Figure 2:
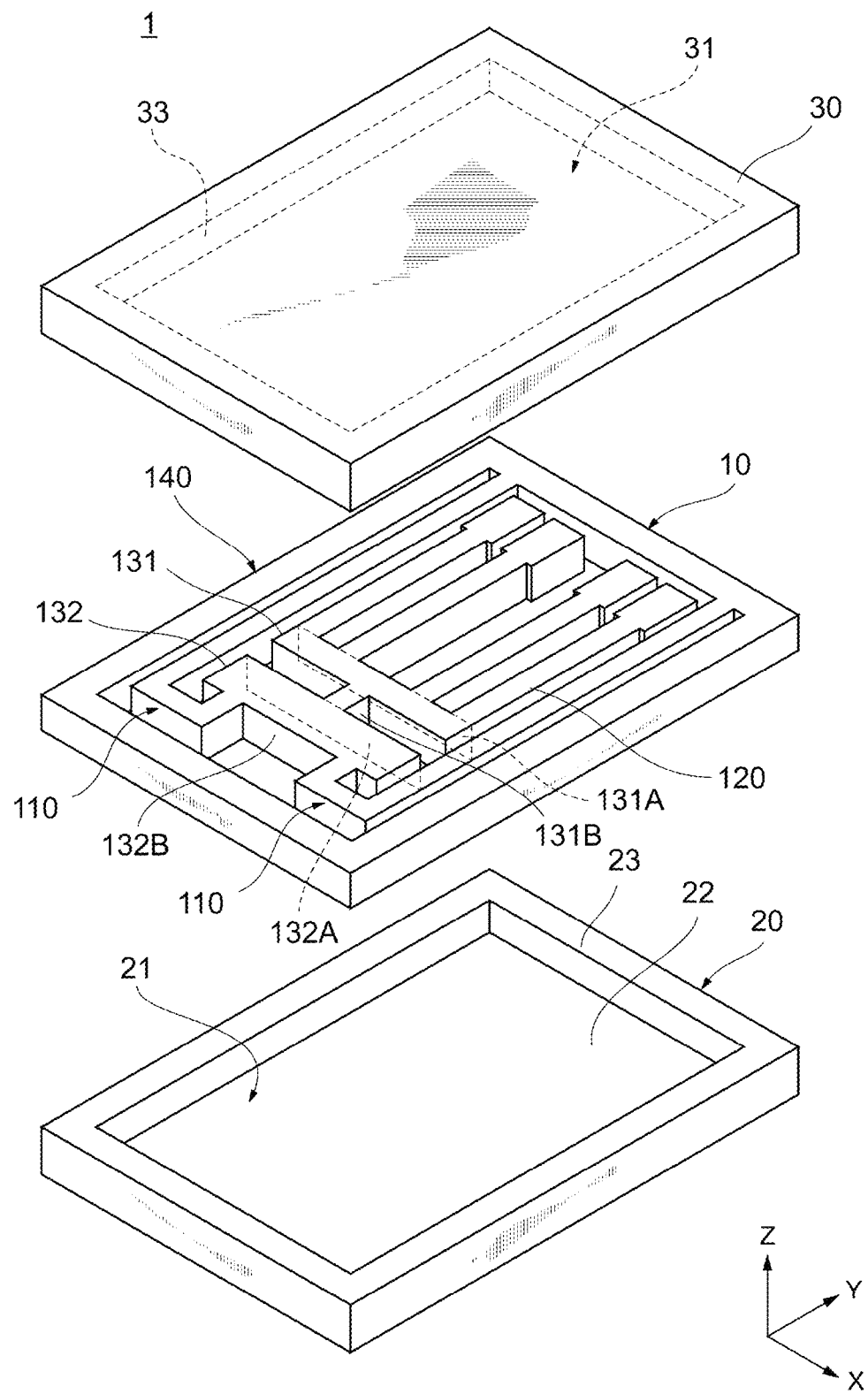
FIG. 2 is an exploded perspective view schematically illustrating a configuration of the resonance device according to the first exemplary embodiment.

Hereinafter, a first exemplary embodiment will be described with reference to the accompanying drawings. FIG. 1 is a perspective view schematically illustrating an outer appearance of a resonance device 1 according to the first exemplary embodiment. FIG. 2 is an exploded perspective view schematically illustrating the configuration of the resonance device 1 according to the first exemplary embodiment.

The resonance device 1 includes a resonator 10, and an upper lid 30 and a lower lid 20 provided with the resonator 10 interposed therebetween. In other words, the resonance device 1 is configured by laminating the lower lid 20, the resonator 10, and the upper lid 30 in this order.

Further, the resonator 10, the lower lid 20, and the upper lid 30 are joined/coupled to each other, thereby sealing the resonator 10 and forming a vibration space of the resonator 10. Each of the resonator 10, the lower lid 20, and the upper lid 30 is formed using an Si substrate, for example. The resonator 10, the lower lid 20, and the upper lid 30 are joined together by joining the Si substrates to each other. The resonator 10 and the lower lid 20 may be formed using an SOI substrate.

According to the exemplary aspect, the resonator 10 is a MEMS resonator that is manufactured using MEMS technology. It is noted that in the exemplary embodiment, the resonator 10 that is formed using the silicon substrate is illustrated, as an example, but the resonator 10 may be formed using a substrate made of a material other than silicon, such as amorphous Si, SiC, SiGe, Ge, gallium arsenide, and quartz.

Hereinafter, the respective configurations of the resonance device 1 will be described in detail.

(1. Upper Lid 30)

The upper lid 30 extends in a flat plate shape along an XY plane, and a recess 31 having, for example, a flat rectangular parallelepiped shape is formed in a rear surface thereof. The recess 31 is surrounded by a side wall 33 and forms a part of the vibration space as a space in which the resonator 10 vibrates.

(2. Lower Lid 20)

The lower lid 20 has a rectangular flat plate-shaped bottom plate 22 provided along the XY plane and a side wall 23 extending from a peripheral edge portion of the bottom plate 22 in a Z-axis direction (i. e., in the lamination direction of the lower lid 20 and the resonator 10). In a surface of the lower lid 20, which faces the resonator 10, a recess 21 formed by the surface of the bottom plate 22 and the inner surface of the side wall 23 is provided. The recess 21 forms a part of the vibration space of the resonator 10. With the above-described upper lid 30 and lower lid 20, this vibration space is hermetically sealed and a vacuum state is maintained. The vibration space may be filled with gas such as inert gas, for example.

(3. Resonator 10)

Figure 3:
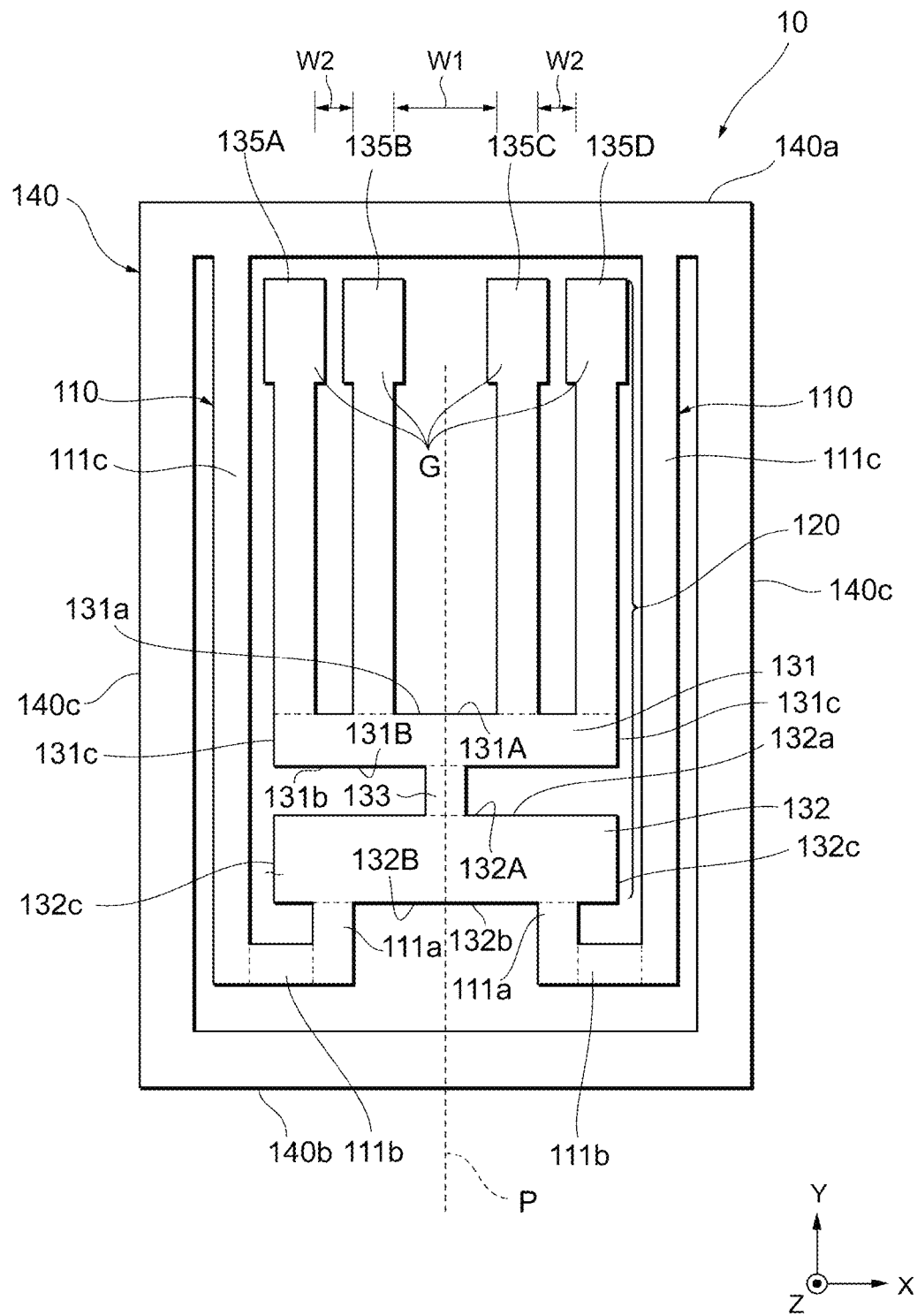
FIG. 3 is a plan view of a resonator according to the first exemplary embodiment in which an upper substrate has been removed.

FIG. 3 is a plan view schematically illustrating the configuration of the resonator 10 according to the embodiment. The respective configurations of the resonator 10 according to the embodiment will be described with reference to FIG. 3. The resonator 10 includes a vibrating portion 120, a holding portion 140 (i.e., a "frame"), and holding arms 110.

(a) Vibrating Portion 120

The vibrating portion 120 has a rectangular contour extending along the XY plane in an orthogonal coordinate system of FIG. 3. Moreover, the vibrating portion 120 is provided on the inner side of the holding portion 140, and a space is formed between the vibrating portion 120 and the holding portion 140 at a predetermined interval. In an example of FIG. 3, the vibrating portion 120 includes a first base or base portion 131, a second base or base portion 132, a connector or connecting portion 133, and four vibrating arms 135A to 135D (also collectively referred to as "vibrating arms 135"). It is noted that the number of vibrating arms is not limited to four, and is set to an arbitrary number, for example, equal to or more than three.

In a plan view, the first base portion 131 has long sides 131a and 131b in an X-axis direction and two short sides 131c in a Y-axis direction. The long side 131a is one side of a front end surface 131A (hereinafter, also referred to as a "first front end 131A") of the first base portion 131 illustrated in FIG. 2. The long side 131b is one side of a rear end surface 131B (hereinafter, also referred to as a "first rear end 131B") of the first base portion 131. In the first base portion 131, the first front end 131A and the first rear end 131B are provided so as to face each other. The first base portion 131 is connected to the vibrating arms 135, which will be described later, at the first front end 131A.

In the first base portion 131, a base portion length (a length of the short sides 131c in FIG. 3) which is a longest distance between the first front end 131A and the first rear end 131B in a direction from the first front end 131A toward the first rear end 131B is about 40 µm. In addition, a base portion width (a length of the long side 131a in FIG. 3) which is a longest distance between the left end and the right end of the first base portion 131 in the width direction orthogonal to the longitudinal direction of the base portion is about 265 µm.

In the example of FIG. 3, the first base portion 131 has a substantially rectangular shape in plan view, but the shape is not limited thereto, and it is sufficient that the first base portion 131 is formed substantially plane-symmetrically with respect to a virtual plane P defined in a Z axis direction along a vertical bisector of the long side 131a. The first base portion 131 may have, for example, a trapezoidal shape whose long side 131b is shorter than 131a or a semicircular shape or an arcuate shape whose long side 131a is a diameter or a string. Further, the long sides 131a and 131b and the short sides 131c are not limited to straight lines, and may be curves.

The second base portion 132 is spaced apart from the first base portion 131 in the Y-axis direction. The second base portion 132 has long sides 132a and 132b in the X-axis direction and two short sides 132c in the Y-axis direction. The long side 132a is one side of a front end surface 132A (hereinafter, also referred to as a "second front end 132A") of the second base portion 132 illustrated in FIG. 2. The long side 132b is one side of a rear end surface 132B (hereinafter, also referred to as a "second rear end 132B") of the second base portion 132. In the second base portion 132, the second front end 132A and the second rear end 132B are provided so as to face each other. Further, the second front end 132A of the second base portion 132 is provided so as to face the first rear end 131B of the first base portion 131. Moreover, the second base portion 132 is connected to and held by the holding portion 140 with the holding arms 110, which will be described later, on the long side 132b.

In the second base portion 132, a base portion length (a length of the short side 132c in FIG. 3) which is a longest distance between the second front end 132A and the second rear end 132B in a direction from the second front end 132A toward the second rear end 132B is about 35 µm. In addition, a base portion width (a length of the long side 132a in FIG. 3) which is a longest distance between the left end and the right end of the second base portion 132 in the width direction orthogonal to the longitudinal direction of the base portion is about 265 µm.

In the example of FIG. 3, the second base portion 132 has a substantially rectangular shape in plan view, but is not limited thereto, and it is sufficient that the second base portion 132 is formed substantially plane-symmetrically with respect to the virtual plane P defined along a vertical bisector of the long side 132a. For example, the second base portion 132 may have a trapezoidal shape whose long side 132b is shorter than 132a, or a semicircular shape or an arcuate shape whose long side 132a is a diameter or a string. Further, the long sides 132a and 132b and the short sides 132c are not limited to straight lines, and may be curves.

Each of the vibrating arms 135 extends in the Y-axis direction and has the same size. Each of the vibrating arms 135 is provided between the first base portion 131 and the holding portion 140 in parallel with the Y-axis direction, and one end thereof is connected to the first front end of the first base portion 131 and is a fixed end and the other end thereof is an open end. Further, the vibrating arms 135 are provided in parallel at predetermined intervals in the X-axis direction. In this embodiment, each of the vibrating arms 135 is integrally formed with the first base portion 131. Note that the vibrating arms 135 have, for example, widths of about 50 µm in the X-axis direction and lengths of about 420 µm in the Y-axis direction.

Further, each of the vibrating arms 135 has a weight G at the open end thereof according to an exemplary aspect. As shown, the weight G has a larger width in the X-axis direction than the other portions of the vibrating arm 135. The weight G has, for example, a width of about 60 µm in the X-axis direction. For example, the weight G is integrally formed by the same process as that of the vibrating arm 135. By forming the weight G, the weight of the vibrating arm 135 per unit length becomes larger at the open end side than at the fixed end side. Accordingly, since each vibrating arm 135 has the weight G at the open end side, the amplitude of vibration of the vibrating arm in the vertical direction can be increased.

In the vibrating portion 120 of the exemplary embodiment, the two vibrating arms 135A and 135D (each of which is an example of a second vibrating arm) are arranged in outer side portions in the X-axis direction, and the two vibrating arms 135B and 135C (each of which is an example of a first vibrating arm) are arranged in inner side portions. An interval W1 between the vibrating arms 135B and 135C in the X-axis direction is set to be larger than an interval W2 between the outer vibrating arm 135A (135D) and the inner vibrating arm 135B (135C), which is adjacent to the outer vibrating arm 135A (135D), in the X-axis direction. The interval W1 is, for example, about 25 µm, and the interval W2 is, for example, about 20 µm. By setting the interval W2 to be smaller than the interval W1, vibration characteristics are improved. Further, in order to reduce the size of the resonance device 1, the interval W1 may be set to be smaller than the interval W2 or may be set to be an equal interval thereto.

The connector or connecting portion 133 (the terms are used interchangeably) connects the first rear end 131B of the first base portion 131 and the second front end 132A of the second base portion 132. The connecting portion 133 has one end connected to the substantially vicinity of the center of the first rear end 131B and extends therefrom along a direction perpendicular to the first rear end 131B. The one end of the connecting portion 133 is preferably connected to the first rear end 131B in an inner side portion relative to the surfaces of the vibrating arms 135B and 135C (as details thereof will be described with reference to FIG. 4, the inner vibrating arms 135B and 135C vibrate in the same phase) as the inner vibrating arms, which are adjacent to the outer vibrating arms 135A and 135D. In this embodiment, the connecting portion 133 is connected to the first rear end 131B between the vibrating arm 135B and the vibrating arm 135C.

The connecting portion 133 has the other end connected to the second base portion 132 in the substantially vicinity of the center of the second front end 132A. It is sufficient that the other end of the connecting portion 133 is connected to at least the substantially vicinity of the center of the second front end 132A, and it may also be connected to a portion other than the vicinity of the center of the second front end 132A. For example, the connecting portion 133 may have a quadrangular pyramid shape whose other end is larger than the one end, and in this case, the other end of the connecting portion 133 may be connected to the whole surface of the second front end 132A.

Further, the vibrating portion 120 according to the exemplary embodiment may include a plurality of connecting portions 133. In this case, each of the plurality of connecting portions 133 may be connected to the first base portion 131 in the inner side portion of the first rear end 131B relative to the surfaces of the vibrating arms 135B and 135C as the inner vibrating arms, which are adjacent to the outer vibrating arms 135A and 135D.

(b) Holding Portion 140

The holding portion 140 (i.e., a "frame") is formed in a rectangular frame shape along the XY plane. In plan view, the holding portion 140 is provided so as to surround an outer side portion of the vibrating portion 120 along the XY plane. It is sufficient that the holding portion 140 is provided at at least a part of the periphery of the vibrating portion 120, and is not limited to have the frame shape. For example, the holding portion 140 may be provided on the periphery of the vibrating portion 120 in such a level as to hold the vibrating portion 120 and be joined to the upper lid 30 and the lower lid 20.

In this embodiment, the holding portion 140 includes frame bodies 140a and 140b and two frame bodies 140c. Note that as illustrated in FIG. 2, the frame bodies 140a to 140c have prismatic shapes that are integrally formed.

As illustrated in FIG. 3, the frame body 140a is provided so as to face the open ends of the vibrating arms 135 such that the longitudinal direction thereof is parallel to the X axis. The frame body 140b is provided so as to face the second rear end 132B of the second base portion 132 such that the longitudinal direction thereof is parallel to the X axis. Each of the two frame bodies 140c is provided so as to face the long side of an arm 111c of the holding arm 110, which will be described later, such that the longitudinal direction thereof is parallel to the Y axis, and is connected, at both ends thereof, to one end of each of the frame bodies 140a and 140b.

(c) Holding Arms 110

The holding arms 110 (a pair of holding arms is shown) are provided in an inner side portion relative to the holding portion 140, and connect the second rear end 132B or the right end and the left end (short sides 132c) of the second base portion 132 and the frame bodies 140c or the frame body 140a. In this embodiment, the holding arms 110 connect the second rear end 132B of the second base portion 132 and the frame body 140a.

The holding arms 110 are integrally formed and have prismatic plate-shaped arms 111a, 111b, and 111c. In the embodiment, the holding arms 110 are formed substantially plane-symmetrically with respect to the virtual plane P defined in parallel to the YZ plane along the center line of a base portion 130 in the X-axis direction.

As illustrated in FIG. 3, each arm 111a is provided between the second base portion 132 and the frame body 140b so as to face the frame body 140c such that the longitudinal direction thereof is parallel to the Y axis. The arm 111a has one end connected to the second base portion 132 at the second rear end 132B of the second base portion 132, and extends therefrom substantially perpendicularly to the second rear end 132B, i. e., in the Y-axis direction. The axis of the arm 111a, which passes through the center thereof in the X-axis direction, is preferably provided in an inner side portion relative to the vibrating arm 135A (135D) provided in the outer side portion at the first front end of the first base portion 131, and in the example of FIG. 3, the arm 111a is provided between the vibrating arms 135A (135D) and 135B (135C).

The arm 111a has the other end connected to one end of the arm 111b on its side surface (a surface on the YZ plane). The arm 111a has a width of about 20 μm, which is defined in the Y-axis direction, and a length of 40 μm, which is defined in the X-axis direction.

Further, the arm 111b is provided between the second base portion 132 and the frame body 140b so as to face the frame body 140b such that the longitudinal direction thereof is parallel to the X axis. The arm 111b has one end connected to the other end of the arm 111a, which is a side surface thereof at the side (outer side) facing the frame body 140c, and the other end connected to one end of the arm 111c, which is a side surface thereof at the side facing the side surface of the second base portion 132. For example, the arm 111b has a length of about 75 μm, which is defined in the X-axis direction, and a width of about 20 μm, which is defined in the Y-axis direction.

The arm 111c is provided between the vibrating arm 135A and the frame body 140c so as to face the frame body 140c such that the longitudinal direction thereof is parallel to the Y axis. The arm 111c has the other end connected to the frame body 140a in an outer side portion relative to a position facing the vibrating arm 135. For example, the arm 111c has a length of about 620 μm, which is defined in the Y-axis direction, and a width of about 20 μm, which is defined in the X-axis direction.

As described above, the holding arms 110 according to the exemplary embodiment are connected to the second base portion 132 at one ends of the arms 111a, are bent at connection places between the side surfaces of the arms 111a at the other ends and the arms 111b, are bent again at connection places between the arms 111b and the arms 111c, and then, are connected to the holding portion 140. As described above, since the holding arms 110 according to the embodiment are configured to be bent, it is possible to hold the second base portion 132 without disturbing the bending displacement of the second base portion 132. As a result, it is possible to reduce increase in a frequency at the time of large-amplitude driving. Consequently, the resonator 10 according to the embodiment can suppress the shift of the resonant frequency. Note that the holding arms 110 are not limited to have the shapes which are bent at right angles at the connection places of the respective arms. The connecting places of the respective arms in the holding arms 110 may have curved shapes.

(4. Laminated Structure)

Figure 4:
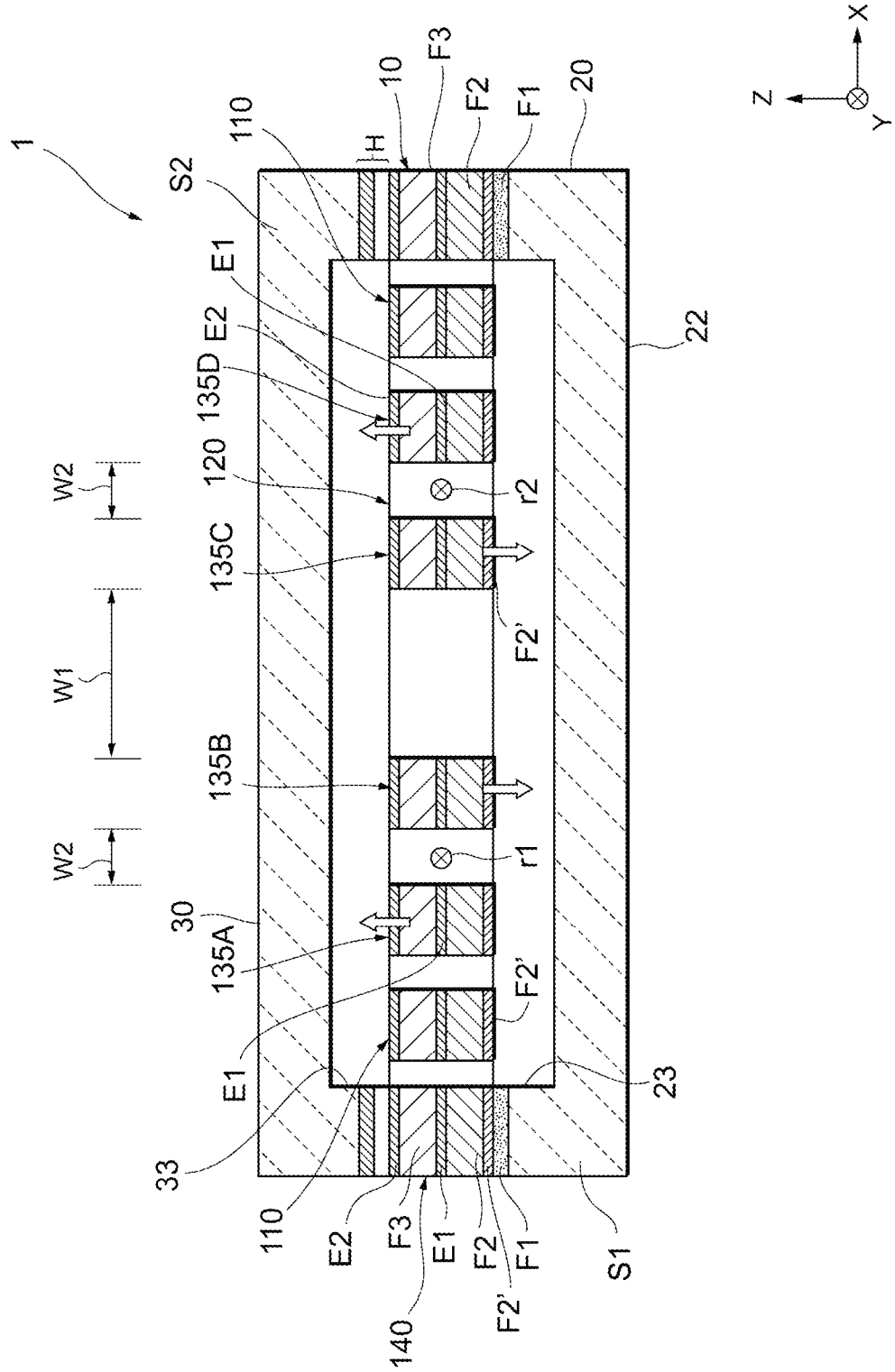
FIG. 4 is a cross-sectional view taken along a line A-A' of FIG. 1.

The laminated structure of the resonance device 1 will be described with reference to FIG. 4. FIG. 4 is a cross-sectional view taken along a line A-A' of FIG. 1.

As illustrated in FIG. 4, in the resonance device 1 according to the exemplary embodiment, the holding portion 140 of the resonator 10 is joined onto the side wall 23 of the lower lid 20, and the holding portion 140 of the resonator 10 and the side wall 33 of the upper lid 30 are joined together. Thus, the resonator 10 is held between the lower lid 20 and the upper lid 30, and the vibration space in which the vibrating arms 135 vibrate is formed by the lower lid 20, the upper lid 30, and the holding portion 140 of the resonator 10.

The bottom plate 22 and the side wall 23 of the lower lid 20 are integrally formed by Si (silicon) wafer S1. A silicon oxide (e.g., $SiO_2$ (silicon dioxide)) layer F1 is formed on the upper surface of the side wall 23 and the lower lid 20 and the holding portion 140 of the resonator 10 are joined to each other by the silicon oxide layer F1. The thickness of the lower lid 20, which is defined in the Z-axis direction is, for example, 150 μm, and the depth of the recess 21 is, for example, 50 μm.

The upper lid 30 is formed of Si (silicon) wafer S2 having a predetermined thickness. As illustrated in FIG. 4, the upper lid 30 is joined to the holding portion 140 of the resonator 10 at its peripheral portion (side wall 33). A joining portion H is formed between a peripheral edge portion of the upper lid 30 and the holding portion 140 in order to join the upper lid 30 and the holding portion 140. The joining portion H is formed of, for example, an Au (gold) film and an Sn (tin) film.

In the resonator 10, the holding portion 140, the base portion 130, the vibrating arms 135, and the holding arms 110 are integrally formed by the same process. In the resonator 10, first, a metal layer E1 is laminated on an Si (silicon) substrate F2 (an example of a substrate). Then, a piezoelectric thin film F3 (an example of a piezoelectric body) is formed on the metal layer E1 so as to cover the metal layer E1. A metal layer E2 is further laminated on the piezoelectric thin film F3.

The Si substrate F2 is formed of, for example, a degenerate n-type Si semiconductor having a thickness of about 10 μm, and can contain P (phosphorus), As (arsenic), Sb (antimony), or the like as an n-type dopant. In particular, it is preferable that a rotation angle formed by the vibrating arms 135 and a [100] crystal axis of the Si substrate F2 formed of the n-type Si semiconductor or a crystal axis equivalent thereto be in a range of larger than 0 degrees and equal to or smaller than 15 degrees (or may be equal to or larger than 0 degrees and equal to or smaller than 15 degrees) or a range of equal to or larger than 75 degrees and equal to or smaller than 90 degrees. Here, the rotation angle refers to an angle of the direction in which the holding arms 110 extend with respect to a segment along the [100] crystal axis of the Si substrate F2 or the crystal axis equivalent thereto.

Further, it is desirable that a resistance value of degenerate Si used for the Si substrate F2 is equal to or larger than 0.5 mΩ·cm and equal to or smaller than 0.9 mΩ·cm. The resistance value of degenerate Si used in this embodiment is, for example, 0.63 mΩ·cm. Further, on the lower surface of the Si substrate F2, the silicon oxide (e.g., $SiO_2$) layer F1 and a temperature characteristic correction layer F2' are formed. Thus, temperature characteristics can be improved. It is also possible to join the lower lid 20 and the holding portion 140 of the resonator 10 by the temperature characteristic correction layer F2' without providing the silicon oxide layer F1. In this embodiment, at least the base portion 130, the vibrating arms 135, and the holding arms 110 are integrally formed by the same Si substrate F2 and the same temperature characteristic correction layer F2'.

In the embodiment, the temperature characteristic correction layer F2' is a layer having a function of reducing a temperature coefficient (i. e., a change rate per temperature) of a frequency in the vibrating portion at at least around normal temperature when the temperature characteristic correction layer F2' is formed on the Si substrate F2 as compared with a case where the temperature characteristic correction layer F2' is not formed on the Si substrate F2. Since the vibrating portion 120 has the temperature characteristic correction layer F2', it is possible to reduce change in the resonant frequency with the temperature of the laminated structure by the Si substrate F2, the metal layers E1 and E2, the piezoelectric thin film F3, and the temperature characteristic correction layer F2'.

In the resonator 10, the temperature characteristic correction layer F2' is preferably formed with a uniform thickness. The uniform thickness means that variation in the thickness of the temperature characteristic correction layer F2' is within ±20% of a thickness average value.

It is noted that the temperature characteristic correction layer F2' may be formed on the upper surface of the Si substrate F2 or on both the upper surface and the lower surface of the Si substrate F2.

In addition, in the holding portion 140, the temperature characteristic correction layer F2' may not be formed on the lower surface of the Si substrate F2.

Further, the metal layers E2 and E1 are formed of, for example, Mo (molybdenum) or aluminum (Al) having a thickness of about 0.1 μm. The Si substrate F2 can also serve as the metal layer E1 by using degenerate Si as the Si substrate F2.

The metal layers E2 and E1 are formed in desired shapes by etching or the like. The metal layer E1 is formed, for example, on the vibrating portion 120 so as to function as a lower electrode (an example of an electrode layer). Further, the metal layer E1 is formed on the holding arms 110 and the holding portion 140 so as to function as a wiring for connecting the lower electrode to an AC power supply provided outside the resonator 10.

On the other hand, the metal layer E2 is formed on the vibrating portion 120 so as to function as an upper electrode (an example of an electrode layer). Further, the metal layer E2 is formed on the holding arms 110 and the holding portion 140 so as to function as a wiring for connecting the upper electrode to the AC power supply provided outside the resonator 10.

For connection from the AC power supply to the lower wiring or the upper wiring, the configuration in which an electrode is formed on an outer surface of the upper lid 30 and the electrode connects the AC power supply and the lower wiring or the upper wiring or the configuration in which a via is formed in the upper lid 30, the via is filled with a conductive material to provide a wiring, and the wiring connects the AC power supply and the lower wiring or the upper wiring may be used.

According to the exemplary aspect, the piezoelectric thin film F3 is a thin film of a piezoelectric body which converts an applied voltage into vibration, and can mainly contain nitride such as AlN (aluminum nitride) or oxide. Specifically, the piezoelectric thin film F3 can be formed of ScAlN (scandium aluminum nitride). ScAlN is provided by substituting a part of aluminum in aluminum nitride with scandium. Further, the piezoelectric thin film F3 has, for example, a thickness of 1 μm.

The piezoelectric thin film F3 expands and contracts in the in-plane direction of the XY plane, i. e., in the Y-axis direction, according to an electric field applied to the piezoelectric thin film F3 by the metal layers E2 and E1. Due to the expansion and contraction of the piezoelectric thin film F3, the vibrating arms 135 displace their open ends toward the inner surfaces of the lower lid 20 and the upper lid 30 and vibrate in the out-of-plane bending vibration mode.

In this embodiment, the phase of the electric fields that are applied to the outer vibrating arms 135A and 135D and the phase of the electric fields that are applied to the inner vibrating arms 135B and 135C are set to be opposite to each other. Thus, the outer vibrating arms 135A and 135D and the inner vibrating arms 135B and 135C are displaced in opposite directions. For example, when the outer vibrating arms 135A and 135D displace their open ends toward the inner surface of the upper lid 30, the inner vibrating arms 135B and 135C displace their open ends toward the inner surface of the lower lid 20.

In the resonance device 1 as described above, the vibrating arm 135A and the vibrating arm 135B vibrate in the opposite phases, i. e., vibrate in directions vertically opposite to each other about a center axis r1 extending in parallel to the Y axis between the vibrating arm 135A and the vibrating arm 135B illustrated in FIG. 4. Further, the vibrating arm 135C and the vibrating arm 135D vibrate in directions vertically opposite to each other about a center axis r2 extending in parallel to the Y axis between the vibrating arm 135C and the vibrating arm 135D. As a result, torsional moments in opposite directions are generated in the center axes r1 and r2, and bending vibrations occur in the base portion 130.

(5. Node Point)

Figure 5:
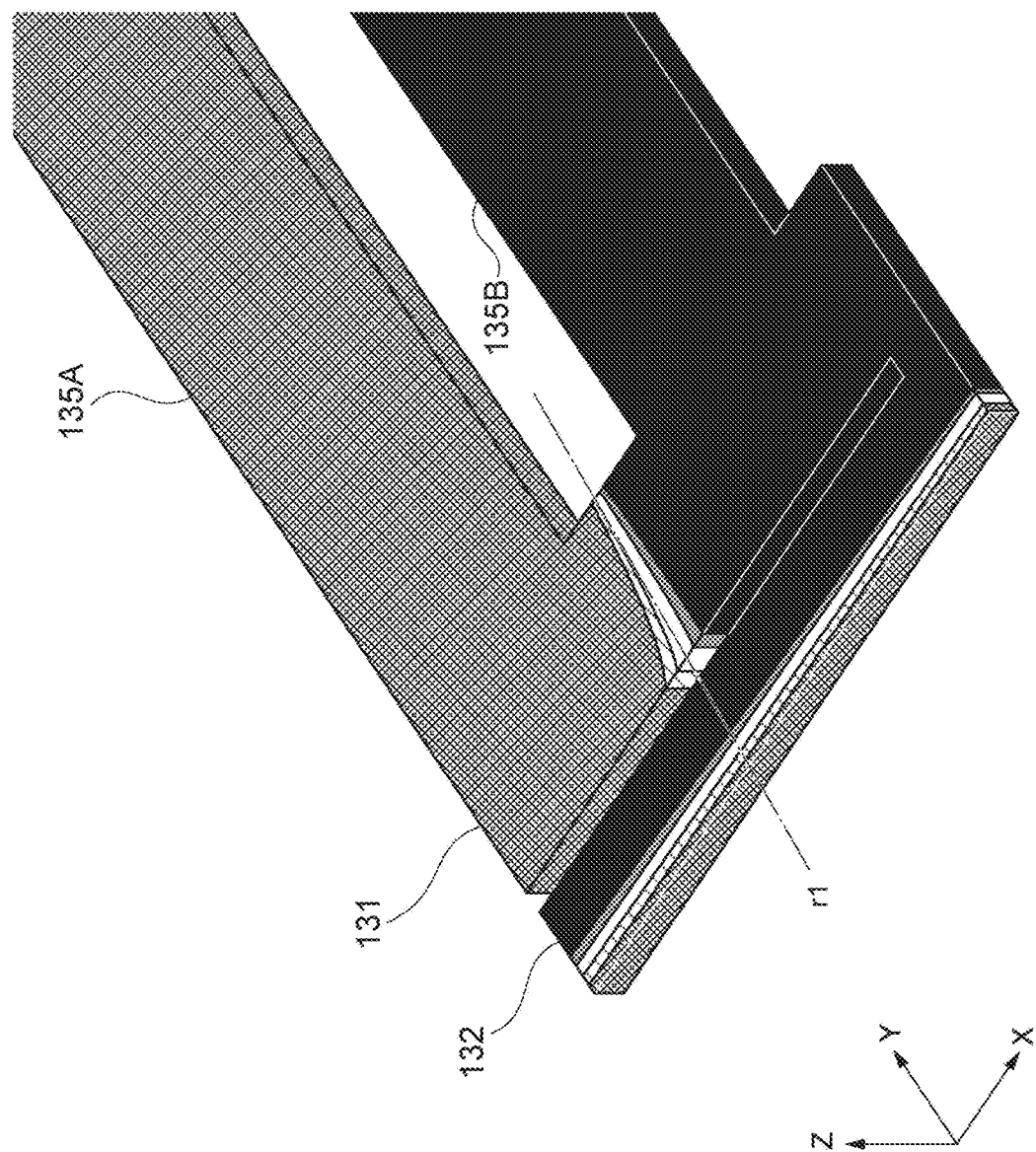
FIG. 5 is a view illustrating distribution of a displacement amount of vibration of the resonator according to the first exemplary embodiment.
Figure 6:
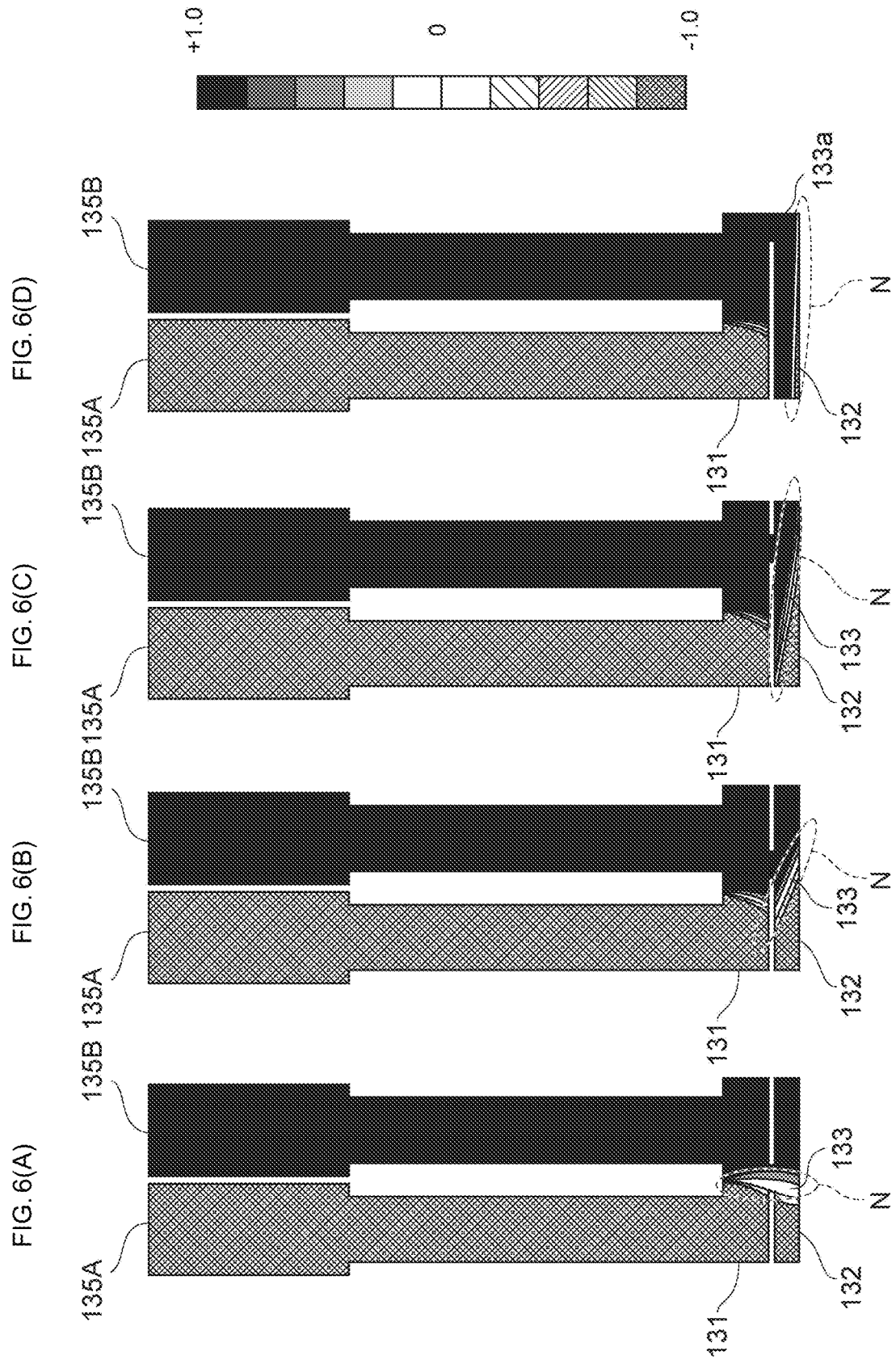
FIGS. 6(A) to 6(D) are views illustrating distribution of a displacement amount of vibration of each of the resonator according to the first exemplary embodiment and a resonator in a comparative example.

Referring to FIGS. 5 and 6, a node that is generated by the connecting portion 133 according to the embodiment will be described. FIGS. 5 and 6 are views schematically illustrating distribution of the displacement amount of the vibrating portion 120 due to the vibration of the vibrating portion 120 in the resonator 10 in the embodiment or a comparative example. In FIGS. 5 and 6, the vibrating arms 135A and 135B, the first base portion 131, and the second base portion 132 in each resonator 10 are enlarged and their displacement amounts are illustrated. In FIGS. 5 and 6, dark-colored portions indicate portions with larger displacement than that of light-colored portions. Specifically, sites where shading is represented by black or gray scale indicate sites with displacement along the Z-axis positive direction and sites where shading is represented by hatching indicate sites with displacement along the Z-axis negative direction. Note that the displacement amounts on portions with white are 0 (zero), i. e., the portions indicate node points or lines with gathered node points.

As described above with reference to FIG. 4, when the outer vibrating arm 135A and the inner vibrating arm 135B vibrate in the opposite phases, the displacement between the vibrating arms 135A and 135B becomes smaller than that in the case where the vibrating arms vibrate in the same phase while the torsional moments are generated about the center axis r1. On the other hand, the vibrating arms 135B and 135C which vibrate in the same phase are connected to a region at the center of the first base portion 131 (inner side portion relative to the surface of the vibrating arm 135B, which is adjacent to the vibrating arm 135A). Therefore, in this region, the torsional moment about the direction in which the vibrating arms 135 extend is small. Accordingly, the first base portion 131 is connected to the connecting portion 133 at the center of the first rear end 131B, so that the influence by the torsional moment which is transmitted to the second base portion 132 can be reduced. As a result, the direction of the node line that is generated in the second base portion 132 can be brought closer to the direction along the width direction. Therefore, it is possible to widen regions where the holding arms 110 are hardly influenced by the torsional moment in regions where the holding arms 110 can be connected to the second base portion 132. As a result, it is possible to reduce the influence of vibration leakage from the second base portion 132 to the holding arms 110 and prevent the vibration of the vibrating portion 120 from being disturbed, thereby suppressing the shift of the resonant frequency of the resonance device 1.

FIGS. 6(A) to (D) are views illustrating difference between node lines N that are generated by the resonator in the comparative example (FIGS. 6(A) and (B)) and node lines N that are generated by the resonator 10 according to the invention (FIGS. 6(C) and (D)).

In FIG. 6(A), the connecting portion 133 is connected to the first base portion 131 at a position between the vibrating arms 135A and 135B. In addition, in FIG. 6(B), the connecting portion 133 is connected to the first base portion 131 in a region closer to the vibrating arm 135B between the vibrating arms 135A and 135B.

As described above, the torsional moment is generated between the vibrating arms 135A and 135B. Accordingly, when the connecting portion 133 is connected to the vicinity of a region between the vibrating arms 135A and 135B, the torsional moment is transmitted to the second base portion 132 while passing through the connecting portion 133. Therefore, the distribution of the displacement amount in the second base portion 132 is similar to that in the first base portion 131. As a result, as illustrated in FIGS. 6(A) and 6(B), the node line N in the second base portion 132 is generated in a direction substantially perpendicular to the width direction of the second base portion 132. In this case, the generated node line N is limited to a site where the displacement amount of the second rear end 132B is small, that is, the node line N to a narrow range. As such, for example, when the holding arms 110 are tried to be connected to the second rear end 132B at the node line N in a manufacturing process but deviate from the node line N undesirably, the vibration of the vibrating portion 120 leaks to the holding arms 110, resulting in disturbance to the vibration of the vibrating portion 120.

On the other hand, as illustrated in FIGS. 6(C) and 6(D), in the resonator 10 according to the embodiment, the connecting portion 133 is connected to the first rear end 131B in the inner side portion relative to the surface of the vibrating arm 135B, which is adjacent to the vibrating arm 135A. Thus, the direction of the node line N that is generated in the second rear end 132B of the second base portion 132 can be made along the width direction to thereby widen the region where the holding arms 110 can be connected to the second base portion 132 with no influence by the torsional moment. With this configuration, even if the connecting positions of the holding arms 110 vary in the manufacturing process, it is possible to prevent the vibration of the vibrating portion 120 from being disturbed due to leakage of the vibration of the vibrating portion 120 to the holding arms 110, thereby suppressing the shift of the resonant frequency of the resonance device.

Second Exemplary Embodiment

In the second and subsequent exemplary embodiments, description of matters common to those in the first embodiment will be omitted and only different points will be described. In particular, similar operational effects with the same configurations will not be described in order in each embodiment.

Figure 7:
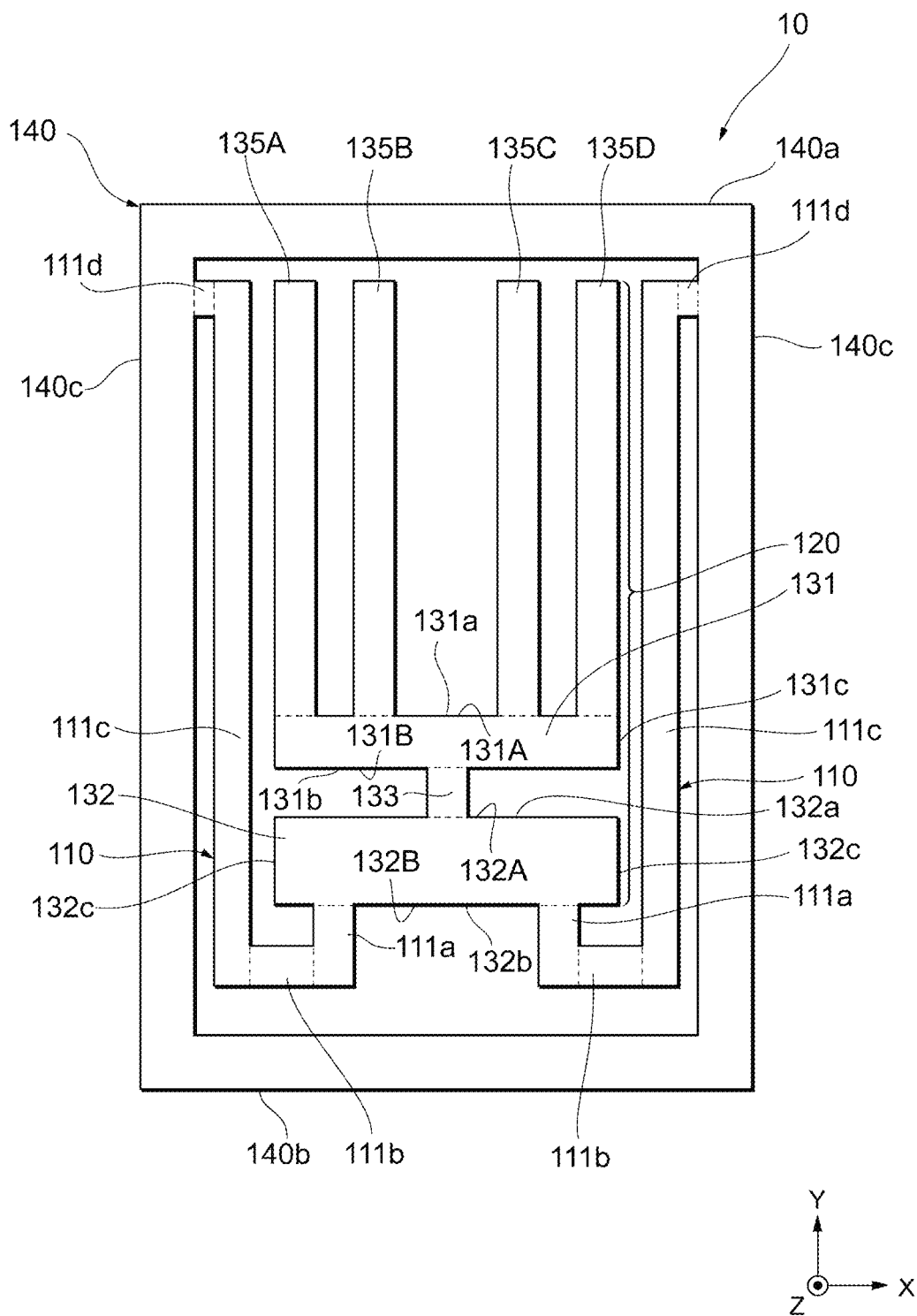
FIG. 7 is a plan view of a resonator according to a second exemplary embodiment, which corresponds to FIG. 3 and in which an upper substrate has been removed.

FIG. 7 is a view illustrating an example of a plan view of the resonator 10 according to the exemplary embodiment. Description will be mainly given to different points from the first embodiment in the detailed configuration of the resonance device 1 according to the embodiment.

As shown in this embodiment, the vibrating portion 120 is connected to the holding portion 140 on the frame bodies 140c with the holding arms 110 connected to the second rear end 132B of the second base portion 132. Further, none of the vibrating arms 135 has the weight G. In other words, each of the vibrating arms 135 has a constant width from a fixed end to an open end. The other configurations of the vibrating portion 120 are similar to those in the first embodiment.

In this embodiment, the holding arms 110 have arms 111d in addition to the arms 111a to 111c. Each holding arm 110 has one end connected to the second base portion 132 at the second rear end 132B and extends therefrom toward the frame body 140b. Then, the holding arm 110 is bent in a direction toward the frame body 140c (that is, in the X-axis direction), is bent in a direction toward the frame body 140a (that is, in the Y-axis direction), is further bent in the direction toward the frame body 140c, and is connected, at the other end, to the frame body 140c.

The arm 111c is provided between the second base portion 132 and the frame body 140c so as to face the frame body 140c such that the longitudinal direction thereof is parallel to the Y-axis direction. The arm 111c has one end connected to the arm 111b on its side surface. Further, the arm 111c has the other end connected to one end of the arm 111d on its side surface. For example, the arm 111c has a width of about 20 μm, which is defined in the X-axis direction, and a length of about 620 μm, which is defined in the Y-axis direction.

The arm 111d is provided between the vibrating arm 135A (or the vibrating arm 135D) and the frame body 140c so as to face the frame body 140a such that the longitudinal direction thereof is parallel to the X-axis direction. The arm 111d has the one end connected to the other end of the arm 111c, which is a side surface thereof at the side (outer side) facing the frame body 140c. Further, the arm 111d has the other end connected to the frame body 140c at a position facing an end portion of the open end of the vibrating arm 135A (or the vibrating arm 135 D), and extends therefrom substantially perpendicularly to the frame body 140c, i. e., in the X-axis direction. For example, the arm 111d has a width of about 20 μm, which is defined in the Y-axis direction, and a length of about 10 μm, which is defined in the X-axis direction.

As described above, in this embodiment, the vibrating portion 120 is connected to the frame bodies 140c with the holding arms 110. By increasing the bent sites of the holding arms 110, it is possible to further disperse the moments in the holding arms 110 and to further enhance the effect of suppressing the resonant frequency shift.

Other configurations and effects are the same as those of the first embodiment.

Third Exemplary Embodiment

Figure 8:
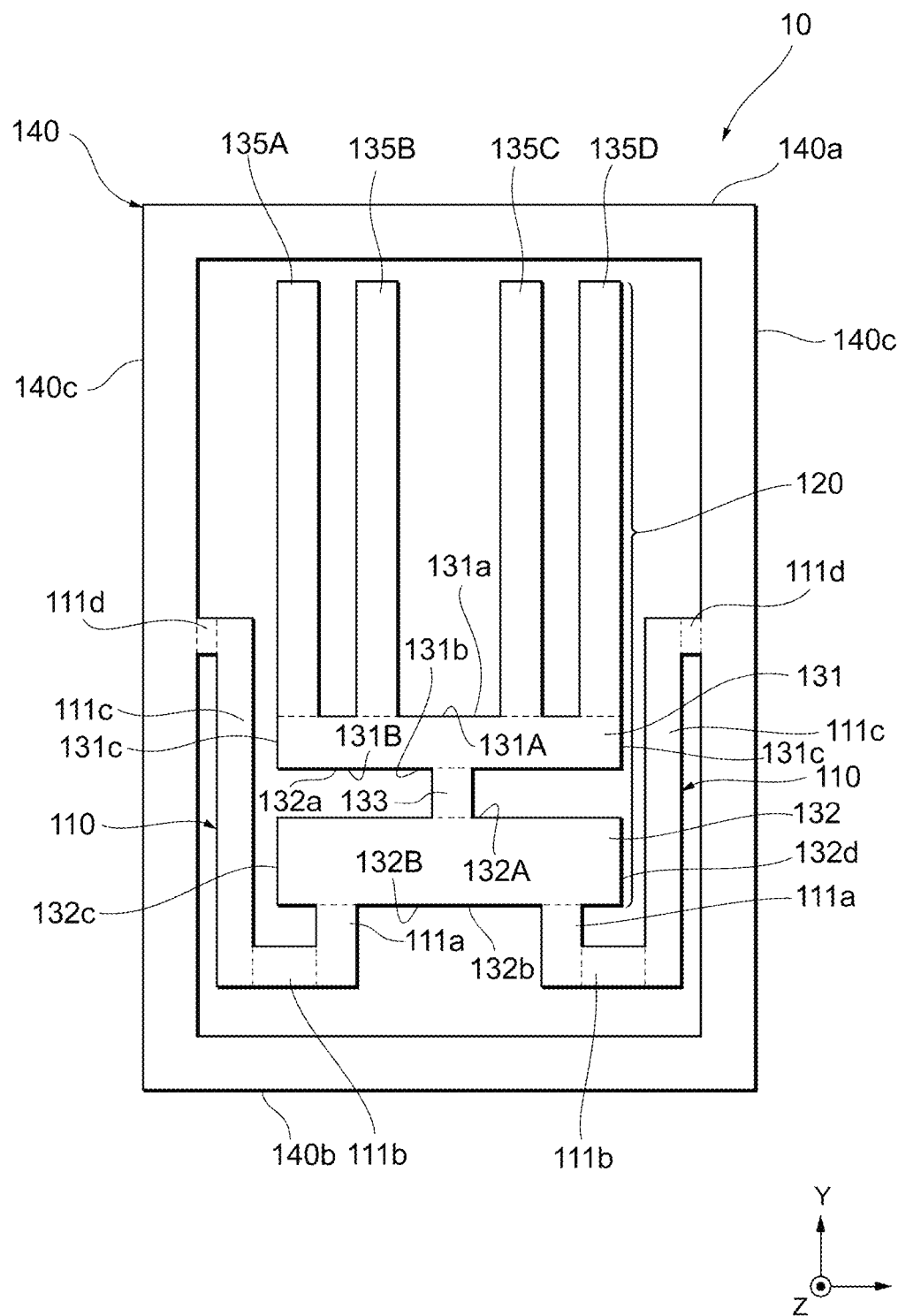
FIG. 8 is a plan view of a resonator according to a third exemplary embodiment, which corresponds to FIG. 3 and in which an upper substrate has been removed.

FIG. 8 is a view illustrating an example of a plan view of the resonator 10 according to the exemplary embodiment. Description will be mainly given to different points from the second embodiment in the detailed configuration of the resonance device 1 according to the embodiment.

In this embodiment, the arm 111c of each holding arm 110 has, for example, a width of about 20 μm, which is defined in the X-axis direction, and a length of about 320 μm, which is defined in the Y-axis direction. That is, the length of the arm 111c in the embodiment, which is defined in the Y-axis direction, is smaller than that of the arm 111c in the second embodiment. Therefore, the arm 111d has the other end connected to the frame body 140c at a position in the vicinity of the center of the frame body 140c, and extends therefrom substantially perpendicularly to the frame body 140c in the X-axis direction.

Other configurations and functions are the same as those of the second embodiment.

Fourth Exemplary Embodiment

Figure 9:
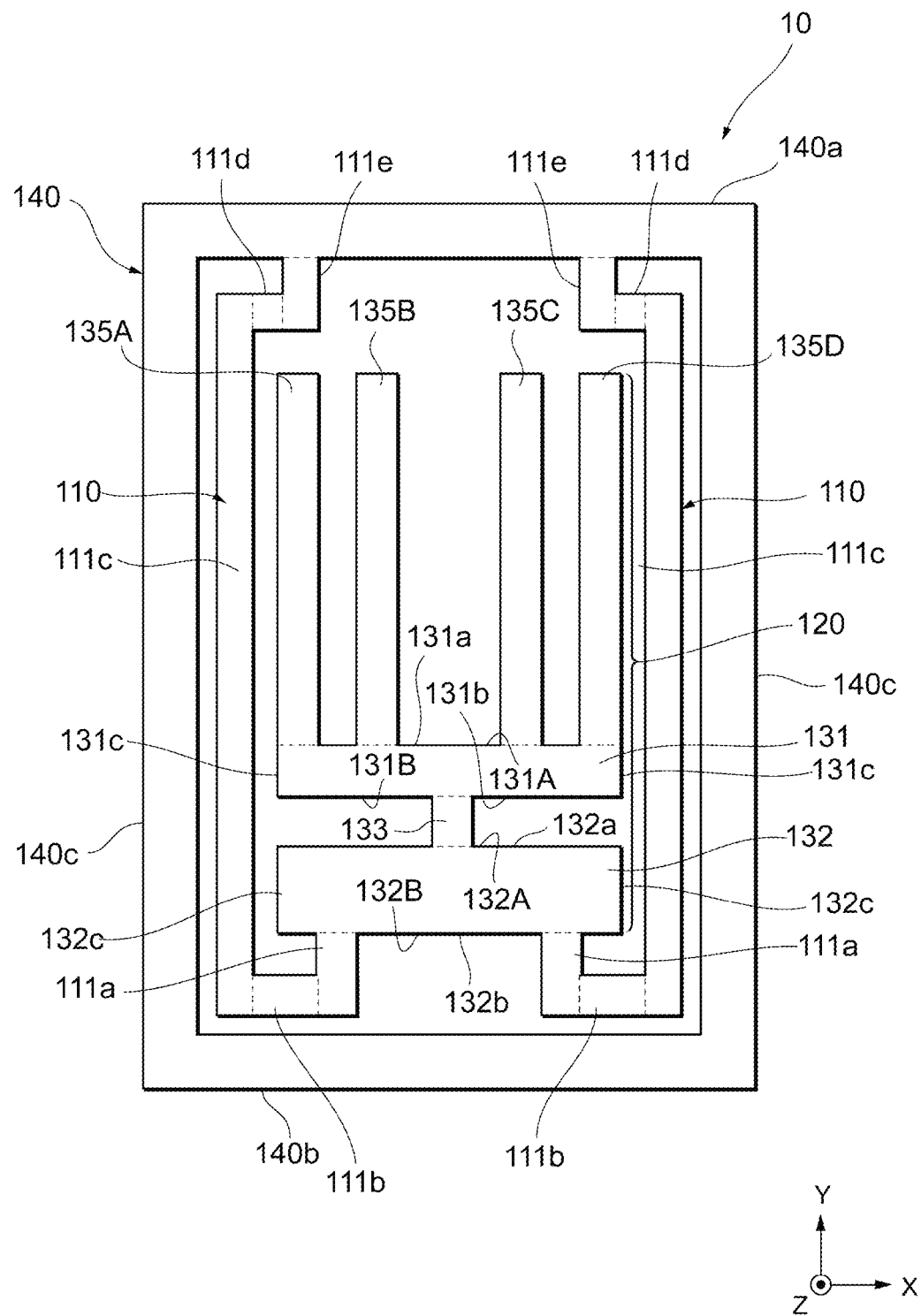
FIG. 9 is a plan view of a resonator according to a fourth exemplary embodiment, which corresponds to FIG. 3 and in which an upper substrate has been removed.

FIG. 9 is a view illustrating an example of a plan view of the resonator 10 according to the embodiment. Description will be mainly given to different points from the second embodiment in the detailed configuration of the resonance device 1 according to the embodiment.

In this embodiment, the holding arms 110 have arms 111e in addition to the arms 111a to 111d. Each holding arm 110 has one end connected to the second rear end 132B of the second base portion 132 and extends therefrom toward the frame body 140b. Then, the holding arm 110 is bent in a direction toward the frame body 140c (that is, in the X-axis direction), is bent in a direction toward the frame body 140a (that is, in the Y-axis direction), is bent again in a direction toward the frame body 140d, is further bent in the direction toward the frame body 140a, and is connected, at the other end, to the frame body 140a.

The arm 111d is provided between the vibrating arm 135A (or the vibrating arm 135D) and the frame body 140a so as to face the frame body 140a such that the longitudinal direction thereof is parallel to the X-axis direction. The arm 111d has one end connected to the other end of the arm 111c, which is a side surface thereof at the side (inner side) facing the vibrating arm 135, and extends therefrom substantially perpendicularly to the frame body 140c, i. e., in the X-axis direction. Further, the arm 111d has the other end connected to one end of the arm 111e, which is a side surface thereof at the side facing the frame body 140c. For example, the arm 111d has a width of about 20 µm, which is defined in the Y-axis direction, and a length of about 20 µm, which is defined in the X-axis direction.

The arm 111e is provided between the vibrating arm 135A (or the vibrating arm 135D) and the frame body 140a so as to face the frame body 140c such that the longitudinal direction thereof is parallel to the Y-axis direction. The arm 111e has one end connected to the other end of the arm 111d on the side surface thereof. Further, the arm 111e has the other end connected to the frame body 140a at a position facing the open end of the vibrating arm 135A, and extends therefrom substantially perpendicularly to the frame body 140a, that is, in the Y-axis direction. It is noted that the arm 111e may be formed at the side of the frame body 140c (in an outer side portion) relative to the open end of the vibrating arm 135A. For example, the arm 111e has a width of about 20 µm, which is defined in the X-axis direction and a length of about 40 µm, which is defined in the Y-axis direction.

As described above, in this embodiment, by increasing the bent sites of the holding arms 110, it is possible to further disperse the moments in the holding arms 110 and to further enhance the effect of suppressing the resonant frequency shift.

Other configurations and effects are the same as those of the second embodiment.

Fifth Exemplary Embodiment

Figure 10:
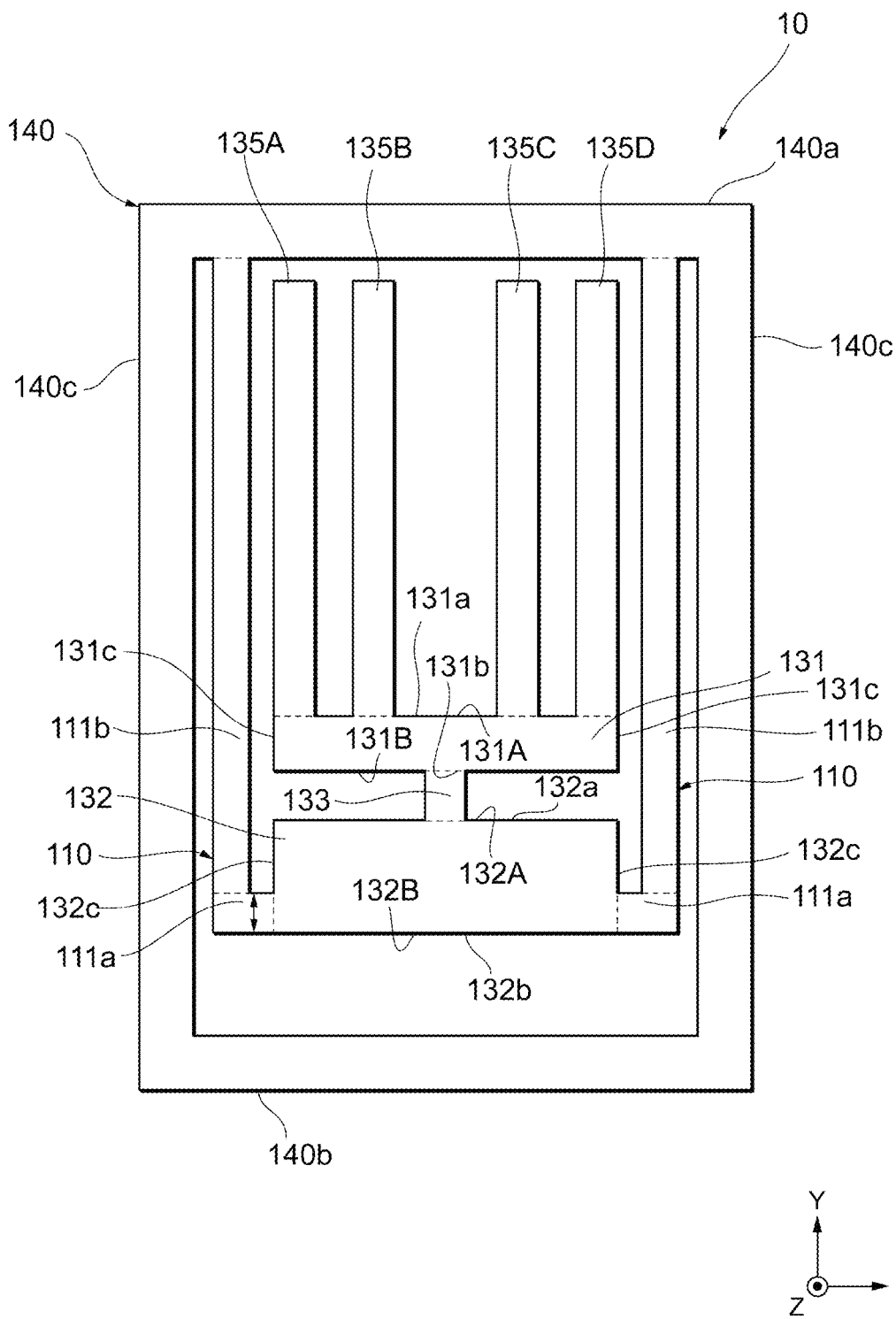
FIG. 10 is a plan view of a resonator according to a fifth exemplary embodiment, which corresponds to FIG. 3 and in which an upper substrate has been removed.

FIG. 10 is a view illustrating an example of a plan view of the resonator 10 according to the exemplary embodiment. Description will be mainly given to different points from the first embodiment in the detailed configuration of the resonance device 1 according to the embodiment.

As shown in this embodiment, the vibrating portion 120 is connected to the holding portion 140 on the frame body 140a with the holding arms 110 connected to the side surfaces (the surfaces at the side of the short sides 132c) of the second base portion 132. Further, none of the vibrating arms 135 has the weight G. In other words, each of the vibrating arms 135 has a constant width from a fixed end to an open end. The other configurations of the vibrating portion 120 are similar to those in the first embodiment.

In this embodiment, the holding arms 110 have arms 111a and 111b. Each holding arm 110 has one end connected to the side surface (the surface at the side of the short side 132c) of the second base portion 132, and extends therefrom toward the frame body 140a. The holding arm 110 is bent in a direction toward the frame body 140a (Y-axis direction), and is connected, at the other end, to the frame body 140a.

Specifically, in this embodiment, the arm 111a is provided between the second base portion 132 and the frame body 140c so as to face the frame body 140b such that the longitudinal direction thereof is parallel to the X-axis direction. The arm 111a has the one end connected to the side surface of the second base portion 132 at the side of the short side 132c at a position where a node line is generated. Further, the arm 111a has the other end connected to the arm 111b on the side surface thereof. The arm 111a has a width of about 20 µm, which is defined in the Y-axis direction, and a length of 40 µm, which is defined in the X-axis direction.

Further, the arm 111b is provided between the vibrating portion 120 and the frame body 140c so as to face the frame body 140c such that the longitudinal direction thereof is parallel to the Y-axis direction. The arm 111b has one end connected to the other end of the arm 111a, which is a side surface thereof facing the frame body 140a, and extends therefrom substantially perpendicularly to the arm 111a, i. e., in the Y-axis direction. Further, the arm 111b has the other end connected to the frame body 140a. For example, the arm 111b has a width of about 20 µm, which is defined in the X-axis direction, and a length of about 620 µm, which is defined in the Y-axis direction.

As described above, the resonator 10 according to the embodiment is configured such that the holding arms 110 have no arm between the second base portion 132 and the frame body 140b. Therefore, since the resonator 10 can decrease a space between the second base portion 132 and the frame body 140b, it is possible to reduce the size.

Other configurations and functions of the resonator 10 are the same as those of the first embodiment.

Sixth Exemplary Embodiment

Figure 11:
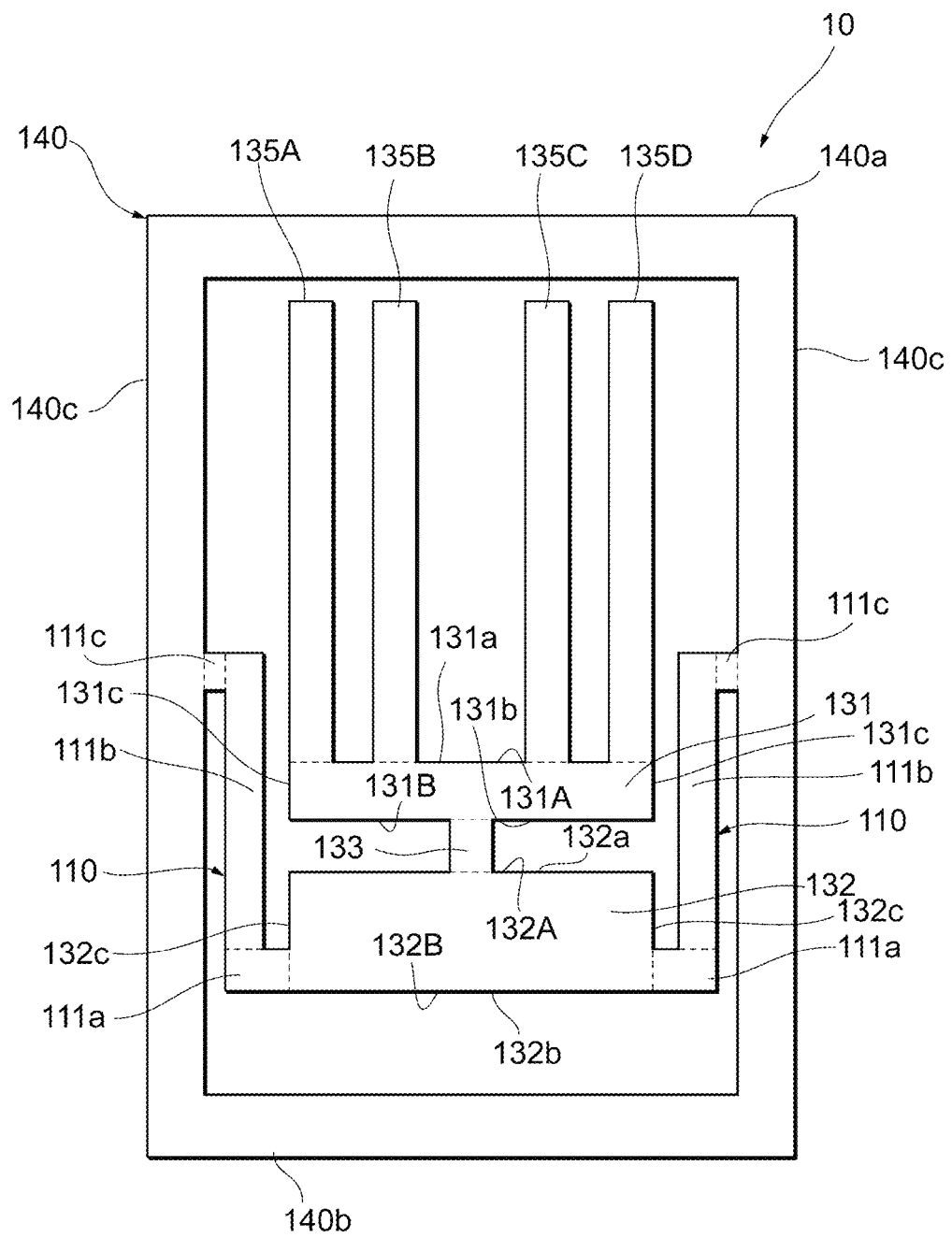
FIG. 11 is a plan view of a resonator according to a sixth exemplary embodiment, which corresponds to FIG. 3 and in which an upper substrate has been removed.

FIG. 11 is a view illustrating an example of a plan view of the resonator 10 according to the embodiment. Description will be mainly given to different points from the fifth embodiment in the detailed configuration of the resonance device 1 according to the embodiment.

As shown in this embodiment, the holding arms 110 have arms 111c in addition to the arms 111a and 111b. Note that the configurations of the arms 111b and 111c according to the embodiment are the same as those of the arms 111b and 111c according to the third embodiment.

Other configurations and effects are the same as those of the fifth embodiment.

Hereinbefore, exemplary embodiments of the invention have been described. The resonator 10 according to the embodiment includes the vibrating portion 120 that has the equal to or more than three vibrating arms 135 each of which has the fixed end and the open end and among which at least the two vibrating arms 135 undergo out-of-plane bending in different phases, the first base portion 131 having the first front end 131A connected to the fixed ends of the equal to or more than three vibrating arms 135 and the first rear end 131B facing the first front end 131A, the second base portion 132 having the second front end 132A facing the first rear end 131B of the first base portion 131 and the second rear end 132B facing the second front end 132A, and the connecting portion 133 having one end connected to the vicinity of the center of the first rear end 131B of the first base portion 131 and the other end connected to the vicinity of the center of the second front end 132A of the second base portion 132, the holding portion 140 that is provided in at least a part of the periphery of the vibrating portion 120, and the holding arms 110 that are provided between the vibrating portion 120 and the holding portion 140 and has one end connected to the second base portion 132 and the other end connected to the holding portion 140. Thus, since the resonator 10 according to the embodiment can generate the node line along the second rear end 132B of the second base portion 132, it is possible to widen the region where the holding arms 110 are hardly influenced by the torsional moment in a region where the holding arms 110 can be connected to the second base portion 132. As a result, it is possible to reduce the influence of vibration leakage from the second base portion 132 to the holding arms 110 and prevent the vibration of the vibrating portion 120 from being disturbed, thereby suppressing the shift of the resonant frequency of the resonance device 1.

Further, it is preferable that one end of the connecting portion 133 be connected to the first rear end 131B of the first base portion 131 in the inner side portion relative to the surface of the vibrating arm 135B (135C) connected to the first base portion 131 in the innermost side portion of the first front end 131A among the vibrating arms 135, which faces the vibrating arm 135A (135D) connected to the base portion 131 in the outer side portion relative to the vibrating arm 135B (135C). Further, it is also preferable that the plurality of vibrating arms 135 include equal to or more than four vibrating arms the number of which is even, and the two vibrating arms 135B and 135C among the even number of vibrating arms 135 are connected, on the first front end 131A of the first base portion 131, to the first base portion 131 symmetrically with respect to the vicinity of the center of the first front end 131A, and the one end of the connecting portion 133 be connected to the first rear end 131B of the first base portion 131 in the inner side portion relative to the surfaces of the two vibrating arms 135B and 135C, which face a plane across which the two vibrating arms 135B and 135C face each other. In this case, the shift of the resonant frequency can be suppressed.

Further, it is also preferable that the other ends of the holding arms 110 be connected to regions of the holding portion 140 at the side of the open ends of the plurality of vibrating arms 135 relative to the second rear end 132B of the second base portion 132. In this case, the holding arms 110 have bent points. As a result, dispersion of the rotational moment occurs in the holding arms 110, so that it is possible to reduce concentration of distortion due to the rotational moment on the first base portion 131 and the second base portion 132, thereby suppressing frequency variation.

Further, since the resonance device according to the embodiment includes the above-described resonator 10, it is possible to suppress the shift of the resonant frequency.

Each of the exemplary embodiments has been described above for facilitating understanding of the invention and is not intended to limit the invention. The invention can be modified and improved without departing from the spirit of the invention and also encompasses equivalents thereof. In other words, the scope of the invention covers those provided by appropriately adding changes in design to each of the embodiments by those skilled in the art as long as they include characteristics of the invention. For example, the elements, and the arrangements, the materials, the conditions, the shapes, the sizes, and the like thereof in each of the embodiments are not limited to exemplified ones, and can be appropriately changed. For example, although the holding arms 110 are bent equal to or more than two times in the above-described embodiments, the invention is not limited thereto. For example, the holding arms 110 may not be bent at all and connect the second rear end 132B of the second base portion 132 and the frame body 140b. It is needless to say that each of the embodiments is illustrative and the configurations described in different embodiments can be partially replaced or combined. The invention also encompasses them as long as they include characteristics of the invention.

REFERENCE SIGNS LIST

1 RESONANCE DEVICE
10 RESONATOR
30 UPPER LID
20 LOWER LID
140 HOLDING PORTION
140a TO 140d FRAME BODY
110 HOLDING ARM
111a TO 114a, 111b TO 114b ARM
120 VIBRATING PORTION
131 FIRST BASE PORTION
132 SECOND BASE PORTION
135A TO 135D VIBRATING ARM
F2 Si SUBSTRATE

The invention claimed is:
1. A resonator comprising:
 a vibrating member including:
  three or more vibrating arms that each include a fixed end and an open end, with at least two of the three or more vibrating arms being configured to undergo out-of-plane bending in different phases;
  a first base having a first front end coupled to the respective fixed ends of the vibrating arms and a first rear end opposite the first front end;
  a second base having a second front end facing the first rear end of the first base and a second rear end opposite the second front end; and
  a connector coupling the first rear end of the first base to the second front end of the second base;
 a frame that at least partially surrounds a periphery of the vibrating member; and
 a holding arm having a first end connected to the second rear end of the second base opposite the second front end and a second end connected to the frame,
 wherein the second end of the holding arm is coupled to a region of the frame at a side of the open ends of the vibrating arms relative to the second rear end of the second base.
2. The resonator according to claim 1, wherein the connector is coupled between a vicinity of a center of the first rear end of the first base and a vicinity of a center of the second front end of the second base.

3. The resonator according to claim 1, wherein the connector is coupled between a center of the first rear end of the first base and a center of the second front end of the second base.

4. The resonator according to claim 1, wherein the connector comprises a first end connected to the first rear end of the first base in an inner side relative to a surface of a first vibrating arm coupled to the first base in an innermost side of the first front end of the three or more vibrating arms that faces a second vibrating arm coupled to the first base in an outer side relative to the first vibrating arm.

5. The resonator according to claim 1, wherein the three or more vibrating arms comprise at least four vibrating arms having an even number.

6. A resonance device comprising the resonator according to claim 1.

7. The resonator according to claim 1, wherein each of the first and second base comprise a rectangular shape in a plan view of the resonator.

8. The resonator according to claim 7, each of the first and second base have a pair of long sides and a pair of short sides forming the respective rectangular shapes, with the respective long sides extending in a direction parallel to each other.

9. The resonator according to claim 8, wherein the connector extends in a direction parallel to a lengthwise direction of shorts sides of the first and second bases and has a width that is less than a length of the long sides of either of the first and second bases.

10. The resonator according to claim 1, wherein the holding arm comprises a pair of holding arms each having a first end coupled to the second rear end of the second base and a second end coupled to the frame.

11. A resonator comprising:
a vibrating member including:
three or more vibrating arms that each include a fixed end and an open end and at least two of the vibrating arms are configured to undergo out-of-plane bending in different phases;
a first base having a first front end coupled to the respective fixed ends of the vibrating arms and a first rear end opposite the first front end;
a second base having a second front end facing the first rear end of the first base and a second rear end opposite the second front end; and
a connector coupling the first rear end of the first base to the second front end of the second base;
a frame that at least partially surrounds a periphery of the vibrating member; and
a holding arm having a first end connected to the second base and a second end connected to the frame,
wherein the three or more vibrating arms comprise at least four vibrating arms having an even number with the even number of vibrating arms being coupled to the first base symmetrically with respect to a center of the first front end of the first base, and
wherein the connector comprises a first end coupled to the first rear end of the first base in an inner side relative to surfaces of the two vibrating arms of the even number, with the surfaces facing a plane across which the two vibrating arms face each other.

12. A resonator comprising:
a vibrating member including:
three or more vibrating arms that each include a fixed end and an open end, with at least two of the three or more vibrating arms being configured to undergo out-of-plane bending in different phases;
a first base having a first front end coupled to the respective fixed ends of the vibrating arms and a first rear end opposite the first front end;
a second base having a second front end facing the first rear end of the first base and a second rear end opposite the second front end; and
a connector coupling the first rear end of the first base to the second front end of the second base;
a frame that at least partially surrounds a periphery of the vibrating member; and
a pair of holding arms each having a first end connected to the second rear end of the second base opposite the second front end and a second end connected to the frame,
wherein the second ends of the pair of holding arms are coupled to a side of the frame that faces the respective open ends of the three or more vibrating arms.

13. A resonator comprising:
a vibrating member including:
three or more vibrating arms that each include a fixed end and an open end, with at least two of the three or more vibrating arms being configured to undergo out-of-plane bending in different phases;
a first base having a first front end coupled to the respective fixed ends of the vibrating arms and a first rear end opposite the first front end;
a second base having a second front end facing the first rear end of the first base and a second rear end opposite the second front end; and
a connector coupling the first rear end of the first base to the second front end of the second base;
a frame that at least partially surrounds a periphery of the vibrating member; and
a holding arm having a first end connected to the second rear end of the second base opposite the second front end and a second end connected to the frame,
wherein the holding arm comprises a pair of holding arms each having a first end coupled to a respective side of the second base that extends in a direction perpendicular to the second rear end of the second base.

14. A resonator comprising:
a vibrating member including:
a first base having opposing first front and rear ends,
a second base having opposing second front and rear ends,
a connector that couples the first base to the second base and has a width less than a width of both the first and second bases, and
three or more vibrating arms each having a fixed end connected to the first front end of the first base and have an open end extended therefrom;
a frame that at least partially surrounds a periphery of the vibrating member; and
a holding arm connecting the second base to the frame,
wherein the connector has a constant width between the first and second bases relative to a direction in which the three or more vibrating arms extend.

15. The resonator according to claim 14, wherein at least two of the vibrating arms are configured to undergo out-of-plane bending in different phases.

16. The resonator according to claim 14, wherein the connector comprises a first end connected to the first rear end of the first base in an inner side relative to a surface of a first vibrating arm coupled to the first base in an innermost side of the three or more vibrating arms that faces a second vibrating arm coupled to the first base in an outer side relative to the first vibrating arm.

17. The resonator according to claim 14, wherein the three or more vibrating arms comprise at least four vibrating arms having an even number.

18. The resonator according to claim 17,
wherein two vibrating arms of the even number of vibrating arms are coupled to the first base symmetrically with respect to a center of the first front end of the first base, and
wherein the connector comprises a first end coupled to the first rear end of the first base in an inner side relative to surfaces of the two vibrating arms of the even number, with the surfaces facing a plane across which the two vibrating arms face each other.

19. The resonator according to claim 14, wherein the second end of the holding arm is coupled to a region of the frame at a side of the open ends of the vibrating arms relative to the second rear end of the second base.

* * * * *